United States Patent
Carmichael et al.

(10) Patent No.: US 8,299,777 B2
(45) Date of Patent: Oct. 30, 2012

(54) CALCULATING A PARASITIC CAPACITANCE OF AN OSCILLATOR CIRCUIT

(75) Inventors: Leslie Carmichael, Littleton, CO (US); Michele Stein, Denver, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 381 days.

(21) Appl. No.: 12/649,590

(22) Filed: Dec. 30, 2009

(65) Prior Publication Data
US 2011/0156725 A1 Jun. 30, 2011

(51) Int. Cl.
*G01R 23/00* (2006.01)
*G01R 27/26* (2006.01)
(52) U.S. Cl. ..................... 324/76.49; 324/681
(58) Field of Classification Search ............. 324/76.39, 324/76.49, 76.51, 658–659, 674–686, 762.01
See application file for complete search history.

(56) References Cited

U.S. PATENT DOCUMENTS

| | | | | |
|---|---|---|---|---|
| 5,594,354 A | * | 1/1997 | Roberts et al. | 324/727 |
| 6,084,482 A | * | 7/2000 | Nakamura | 331/44 |
| 6,300,765 B1 | * | 10/2001 | Chen | 324/519 |
| 6,838,869 B1 | * | 1/2005 | Rogers et al. | 324/762.01 |
| 6,982,555 B2 | * | 1/2006 | Yamashita et al. | 324/519 |
| 7,152,009 B2 | * | 12/2006 | Bokui et al. | 702/107 |
| 7,603,244 B2 | * | 10/2009 | Wang et al. | 702/64 |
| 2002/0097037 A1 | * | 7/2002 | Layton | 324/76.49 |
| 2007/0088517 A1 | * | 4/2007 | Bokui et al. | 702/107 |

OTHER PUBLICATIONS

Gratton, Max, Statement of Facts dated Jan. 7, 2010, 1 page.

* cited by examiner

*Primary Examiner* — Joshua Benitez Rosario
(74) *Attorney, Agent, or Firm* — Lowe Graham Jones PLLC (57) ABSTRACT

Described herein are techniques for determining a board parasitic capacitance of a crystal oscillator circuit. A crystal's frequency is measured under load condition off-circuit. After coupling the crystal to the oscillator circuit, external capacitors may be adjusted to produce frequencies approximating the off-circuit measurement with upper and lower margins. Calculation of the load capacitor values at the exact frequency measured off-circuit allows for derivation of the board parasitic capacitance by subtracting the calculated capacitor values from the original total load value used in the off-circuit measurement.

14 Claims, 4 Drawing Sheets

CALCULATING A PARASITIC CAPACITANCE OF AN OSCILLATOR CIRCUIT

BACKGROUND

Electronic devices typically include an oscillator circuit as a reference to generate specified frequencies for use in the device. For example, an output frequency of an oscillator circuit may be used to provide a clock signal for other circuitry of the electronic device. The frequency of oscillation for the crystal is based on various characteristics of the crystal, such as the shape or 'cut' of the crystal. The load capacitance of the oscillator circuit can also influence the output frequency of the oscillator. The load capacitance is comprised of external capacitors as well as the circuit's parasitics from the circuit board and the pins of the integrated circuits. Typically, the load capacitance of the circuit is estimated during the design process for the overall electronic device. However, if the estimation of the load capacitance is not correct, then the oscillator circuit may operate within the design requirements. Thus, it is desirable to more accurately determine the load capacitance of an oscillator circuit in order to properly design an appropriate oscillator circuit for use in an electronic device.

BRIEF DESCRIPTION OF THE DRAWINGS

The same number represents the same element or same type of element in all drawings.

DETAILED DESCRIPTION OF THE DRAWINGS

Described herein are systems, methods and apparatus for optimizing a circuit design of a crystal oscillator circuit. More particularly, described herein are techniques for deriving a parasitic capacitance of an oscillator circuit. The calculated board capacitance may be utilized to compute optimized values for other components of the oscillator circuit. A designer may utilize the computed values to select components most reliably meeting oscillator requirements to satisfy a particular device design.

In at least one embodiment, a design process includes defining an oscillator circuit's total load capacitance and the starting values of passive components of the oscillator circuit. The process further includes measuring a frequency of one or more circuit boards constructed in accordance with the aforementioned design process and making adjustments to component values based on the frequency measurements. A frequency offset may then be calculated based on the adjusted component value that satisfies requirements of the device incorporating the oscillator circuit.

More particularly, teachings described herein allow for the determination of board parasitic capacitance of a crystal oscillator circuit. A crystal's frequency is measured under load condition off-circuit (e.g., coupled to a crystal analyzer). After soldering the crystal to the oscillator circuit, the external capacitors may be adjusted to produce frequencies approximating the off-circuit measurement with upper and lower margins. Linear interpolation of the load capacitor values at the exact frequency measured off-circuit allows computation of the board parasitics by subtracting the interpolated capacitor values from the original total capacitance load value used in the off-circuit measurement.

Figure 1:
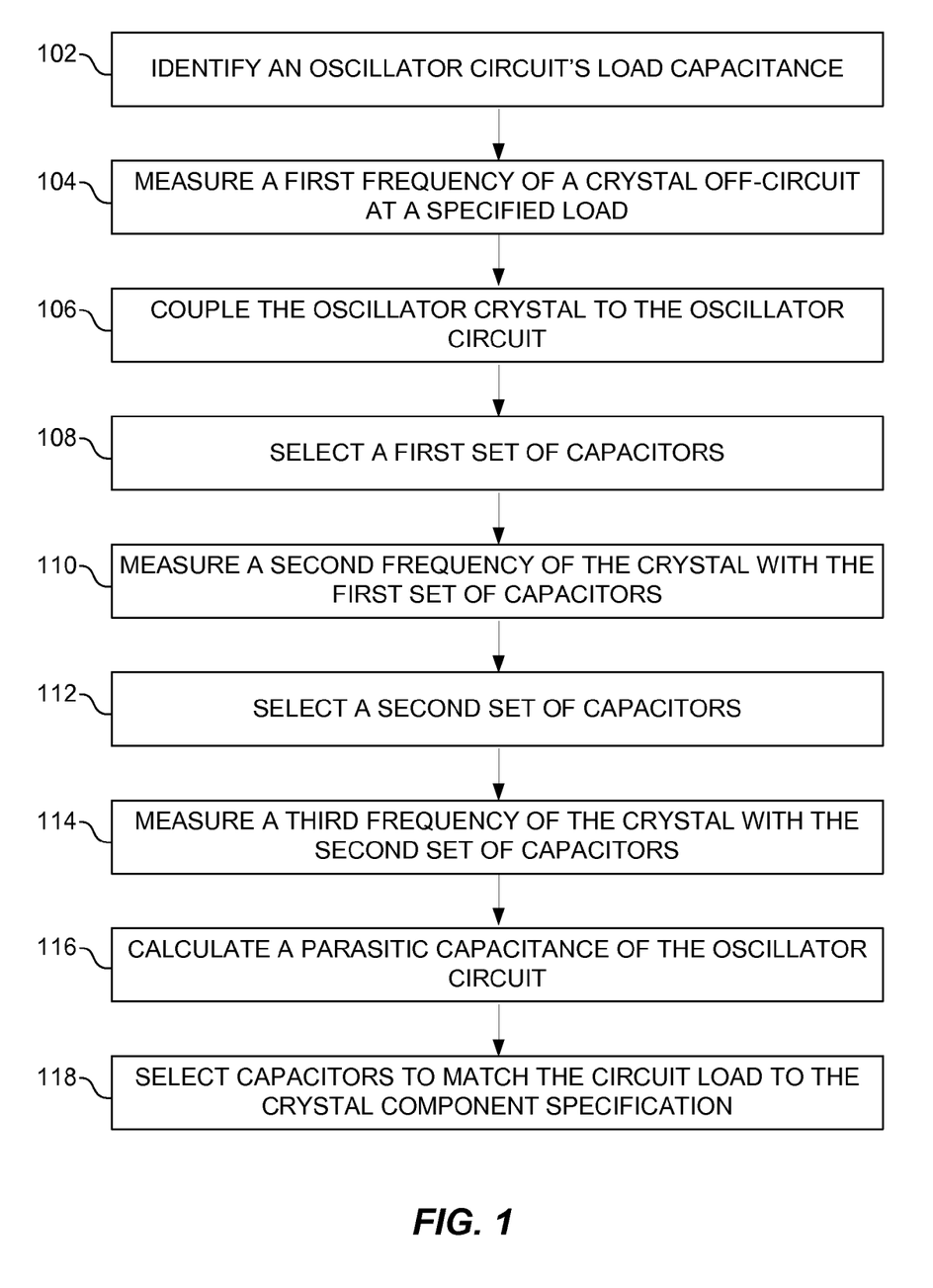
FIG. 1 illustrates an embodiment of a process for determining a parasitic capacitance of an oscillator circuit.

FIG. 1 illustrates an embodiment of a process for determining a parasitic capacitance of an oscillator circuit. FIG. 1 illustrates a process for defining an initial oscillator circuit design and adjusting component values based on frequency measurements. The process of FIG. 1 may include other operations not illustrated for the sake of brevity.

Initially, the process includes identifying the circuit's load capacitance and the starting values for components of the initial circuit design that would be expected to generate a desired frequency of an oscillator circuit (operation 102). For example, the designer may specify the frequency of the oscillator crystal as well as the values of the capacitors included in the oscillator circuit. The expected load capacitance of the circuit includes external capacitors as well as parasitic capacitance, such as the stray capacitance of the board and the capacitance of the integrated circuit (IC) pins. As part of the initial definition process, the designer may estimate a value for the parasitic capacitance of the oscillator circuit and utilize the estimated value to define the value of other components of the oscillator circuit, such as the external capacitors.

In some applications, an IC vendor may specify initial values for load capacitance and/or exemplary component values of the external capacitors that will load the IC's oscillator circuit. These values may then be utilized to derive the definition of the oscillator circuit. For example, if a recommended value for total load capacitance is provided by the IC vendor, then the values of the external capacitors may be computed from the total load. Likewise, if the IC vendor provides recommended values for the external capacitors, then the value of the expected total load may be computed from the external capacitor values. In other embodiments, the initial definition of the expected load capacitance may be calculated based on values of previous load capacitors utilized in similar oscillator circuit applications.

The process further includes measuring a first frequency of an oscillator crystal separate from an oscillator circuit under expected load conditions of the oscillator circuit (operation 104). For example, an oscillator crystal may be coupled to a crystal analyzer to simulate the expected load conditions of the oscillator circuit on the oscillator crystal. The crystal analyzer accurately measures a crystal's frequency at a specified load. However, because the parasitic capacitance of the oscillator circuit is initially estimated, the expected load conditions simulated by the analyzer would be expected to differ from the actual load conditions experienced by the oscillator crystal during operation in the oscillator circuit.

The process further includes coupling the oscillator crystal to the oscillator circuit (operation 106). For example, the oscillator crystal may be soldered onto an oscillator circuit board. In at least one embodiment, the oscillator crystal is allowed to cool before further measurements are made on the oscillator crystal. For example, the crystal may be cooled for a minimum of five minutes before subsequent measurements are made.

The process further includes selecting a first set of capacitors and installing the first set of capacitors in the oscillator circuit (operation 108). For example, the first set of capacitors selected for installation in the oscillator circuit may have the same value as the external capacitors specified in the initial oscillator circuit design during operation 102.

The process further includes measuring a second frequency of the oscillator crystal with a first set of capacitors in the oscillator circuit (operation 110). In at least one embodiment, a parts per million (ppm) offset of the oscillator crystal is determined based on the second measured frequency relative to the first measured frequency.

The process further includes selecting a second set of capacitors and installing the second set of capacitors in place of the first set of capacitors in the oscillator circuit (operation 112). The process further includes measuring a third frequency of the oscillator crystal with the second set of capacitors in the oscillator circuit (operation 114). The third frequency may be measured similarly to the process utilized to measure the second frequency in operation 108. In at least one embodiment, a potentiometer may be utilized that is capable of simulating different capacitor values for the oscillator circuit.

In at least one embodiment, operations 112 and 114 are repeated with different values of capacitors until frequencies are measured on both sides of the first frequency (e.g., the crystal analyzer frequency). In other words, the process of FIG. 1 may include iterative operations that may be performed with different values of capacitors until at least one frequency is measured that is less than the first frequency and at least one frequency is measured that is greater than the first frequency. In at least one embodiment, a minimum of three frequency measurements may be utilized with different values of capacitors on the oscillator circuit.

The process further includes calculating a parasitic capacitance of the oscillator circuit based on a first value of the first set of capacitors and a second value of the second set of capacitors (operation 116). The first and second set of capacitors utilized to calculate the parasitic capacitance are the selected values of capacitors resulting in frequencies closest to the first frequency measured on the crystal analyzer. In at least one embodiment, the selected values may be utilized to interpolate the value of the capacitors had the crystal oscillated at the exact frequency as measured on the crystal analyzer. The interpolated value may then be utilized to calculate the value of the parasitic capacitance of the oscillator circuit. The value of the parasitic capacitance may then be utilized to better match the circuit's total load to the crystal component's specification (operation 118) and satisfy the system requirements of a device incorporating the oscillator circuit. Examples of exemplary operations performed in accordance with the process of FIG. 1 are described in detail below.

EXAMPLE #1

Fundamental Oscillation Circuit

Figure 2:
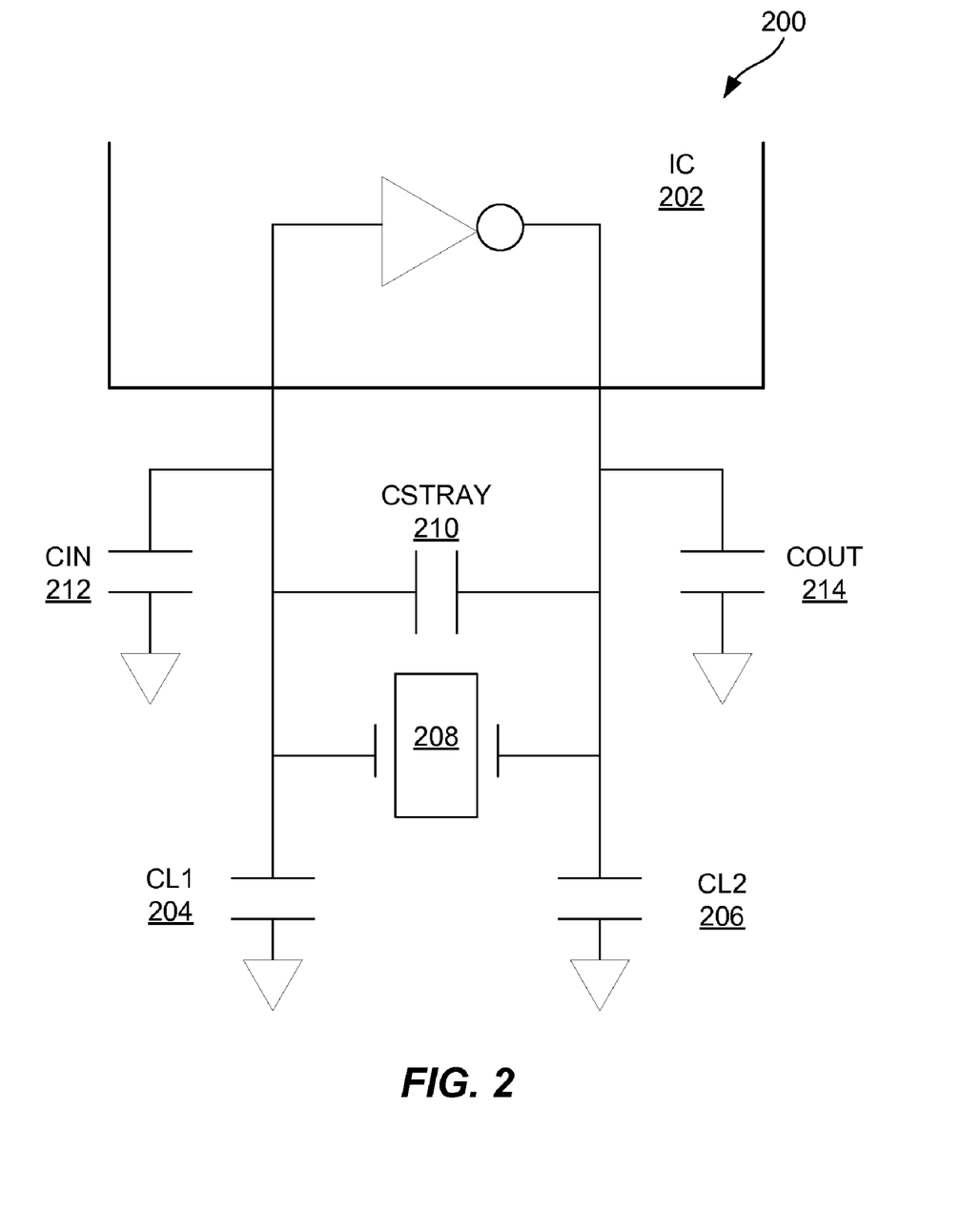
FIG. 2 illustrates an embodiment of a schematic diagram of a fundamental oscillation circuit.

FIG. 2 illustrates an embodiment of a schematic diagram of a fundamental oscillation circuit 200. The oscillation circuit 200 includes an integrated circuit 202, a first capacitor 204 (CL1), a second capacitor 206 (CL2) and an oscillator crystal 208. The capacitance 210 ($C_{stray}$) models the stray capacitance of the circuit board. The input capacitance 212 ($C_{in}$) and the output capacitance 214 ($C_{out}$) model the capacitance of the input and output pins of the integrated circuit 202. As described above, the parasitic capacitance ($C_{para}$) includes the values of $C_{stray}$, $C_{in}$ and $C_{out}$.

For the fundamental oscillation circuit 200, the load capacitance ($C_L$) is defined as follows:

$$C_L = C_{para} + CL1*CL2/(CL1+CL2) \quad \text{Equation (1)}$$

The parasitic capacitance ($C_{para}$) is defined as:

$$C_{para} = C_{stray} + C_{in}*C_{out}/(C_{in}+C_{out}) \quad \text{Equation (2)}$$

First, the expected load capacitance ($C_L$) of the oscillator circuit 200 is defined as well as the starting values for components (e.g., the capacitors 204 (CL1) and 206 (CL2)). Take for example the situation in which the expected load capacitance ($C_L$) is defined as 12 pF, the frequency is defined as 27 MHz and the parasitic capacitance ($C_{para}$) is approximated at 2 pF.

For fundamental oscillation circuits, the values of the capacitors 204 (CL1) and 206 (CL2) are typically the same.

Next, a first frequency of the oscillator crystal is measured under the expected load conditions (12 pF) in a crystal analyzer. For example, the frequency may be measured at 26999757 Hz, which results in a ppm offset of 9 pmm from 27 MHz.

Next, the oscillator crystal 208 is soldered to the oscillator circuit 200 and the frequency of the oscillator crystal 208 is measured with various valued sets of capacitors 204 (CL1) and 206 (CL2). Table #1 illustrates examples of the frequency of the oscillator circuit 200 for various values of CL1 and CL2, where CL1=CL2. The delta frequency is equal to the measured frequency minus 26999757 Hz (e.g., the crystal analyzer frequency). The ppm offset is equal to the delta frequency divided by 27 (e.g., the fundamental frequency in MHz).

TABLE #1

Measured Frequencies of the Oscillator Crystal

| Load Capacitance | Measured Frequency (Hz) | Delta Frequency (Hz) | ppm offset |
|---|---|---|---|
| 15 pF | 27001810 | 2053 | 76 |
| 18 pF | 27000486 | 729 | 27 |
| 22 pF | 26999132 | −625 | −23 |

As illustrated in Table #1, three different values of capacitors 204 (CL1) and 206 (CL2) are utilized to measure a corresponding frequency of the oscillator crystal 208. Further, values of capacitors 204 (CL1) and 206 (CL2) are identified that result in a frequency of the oscillator crystal 208 on both sides of the frequency measured on the crystal analyzer.

In at least one embodiment, once board parasitics are calculated, the load capacitors and/or the crystal component's load specification may need adjustment for the final design. For example, if the system requires a lower frequency, then the value of load capacitors in the final design may be changed to match the capacitors corresponding to the lowest ppm offset. For the above example, if CL1=CL2 was initially set to 15 pF (e.g., 76 ppm offset), then the values of the capacitors 204 (CL1) and 206 (CL2) may be changed to 22 pF (e.g., −23 ppm offset). This yields a permanent design offset of −23 ppm for the oscillator circuit 200.

In at least one embodiment, the load capacitance $C_L$ for the circuit may be changed in the crystal specification. First, the parasitic capacitance ($C_{para}$) of the circuit may be calculated based on a linear interpolation between CL1/CL2 values which would correspond to the frequency measured on the analyzer. The frequencies measured with capacitor values of 18 pF and 22 pF are closest in value to the frequency measured off-circuit.

As illustrated in Equation 3, the value of the capacitance ($C_{v3}$) utilized in measuring the frequency ($F_1$) off-circuit may be determined based on the first frequency ($F_1$), the second frequency ($F_2$), the third frequency ($F_3$) and the first and second capacitor values ($C_{v1}$ and $C_{v2}$) associated with the measurements of the second and third frequencies, where $O_1$ is a first offset of $F_2$ relative to $F_1$ and $O_2$ is a second offset of $F_3$ relative to $F_1$.

$$C_{v3} = C_{v1} + (C_{v2} - C_{v1})*O_2/(O_2 - O_1) \quad \text{Equation 3}$$

Interpolating between 18 pF ($C_{v1}$) and 22 pF ($C_{v3}$) utilizing Equation 3 results in the following calculations:

$$18pF+(22-18)*27/(27+23)=18pF+2.16pF=20.16pF$$

Next, the parasitic capacitance $C_{para}$ may be determined for the first frequency measured off-circuit by subtracting the value of the capacitors (C1 and C2) expected to replicate the frequency measured by the crystal analyzer as illustrated in Equation 4. The capacitors (C1 and C2) are both defined as the value of $C_{v3}$ computed in Equation 3, and $C_{total}$ is equivalent to $C_{Lspec}$ (the crystal's load specification).

$$C_{para}=C_{total}-CL1*CL2/(CL1+CL2)=C_{Lspec}-C_{v3}/2 \qquad \text{Equation 4}$$

$$C_{para}=12pF-20.16pF/2=1.92pF$$

As illustrated in the above computation, the parasitic capacitance ($C_{para}$) of the circuit board is determined to be 1.92 pF. The value of the parasitic capacitance ($C_{para}$) may then by utilized in Equation 4 for different values of CL1 and CL2, e.g., when CL1 and CL2 are equal to $C_{v1}$ (18 pF) or are equal to $C_{v2}$ (22 pF).

If CL1 and CL2 are left on the final circuit design at a value of 18 pF ($C_{v1}$), then the value of $C_{total}$ (e.g., the new load capacitance) is calculated as follows:

$$C_{total}=C_{para}+CL1*CL2/(CL1+CL2)=1.92pF+\\9pF=10.92pF\sim11pF$$

If CL1 and CL2 are left at 22 pF ($C_{v2}$), then the value of $C_{total}$ (e.g., the new load capacitance) is adjusted as follows:

$$C_{total}=C_{para}+CL1*CL2/(CL1+CL2)=1.92pF+\\11pF=12.92pF\sim13pF$$

A selection of one of the desired load capacitance ($C_{Lspec}$) values may be utilized and incorporated into the overall design of a device utilizing the crystal oscillator circuit 200. Multiple factors, such as the trim sensitivity ($T_s$), temperature tolerance, aging and the like may also be utilized to select one of the capacitor values ($C_{v1}$) and ($C_{v2}$) for use in the final design of the oscillator circuit 200.

EXAMPLE #2

Overtone Oscillation Circuit

Figure 3:
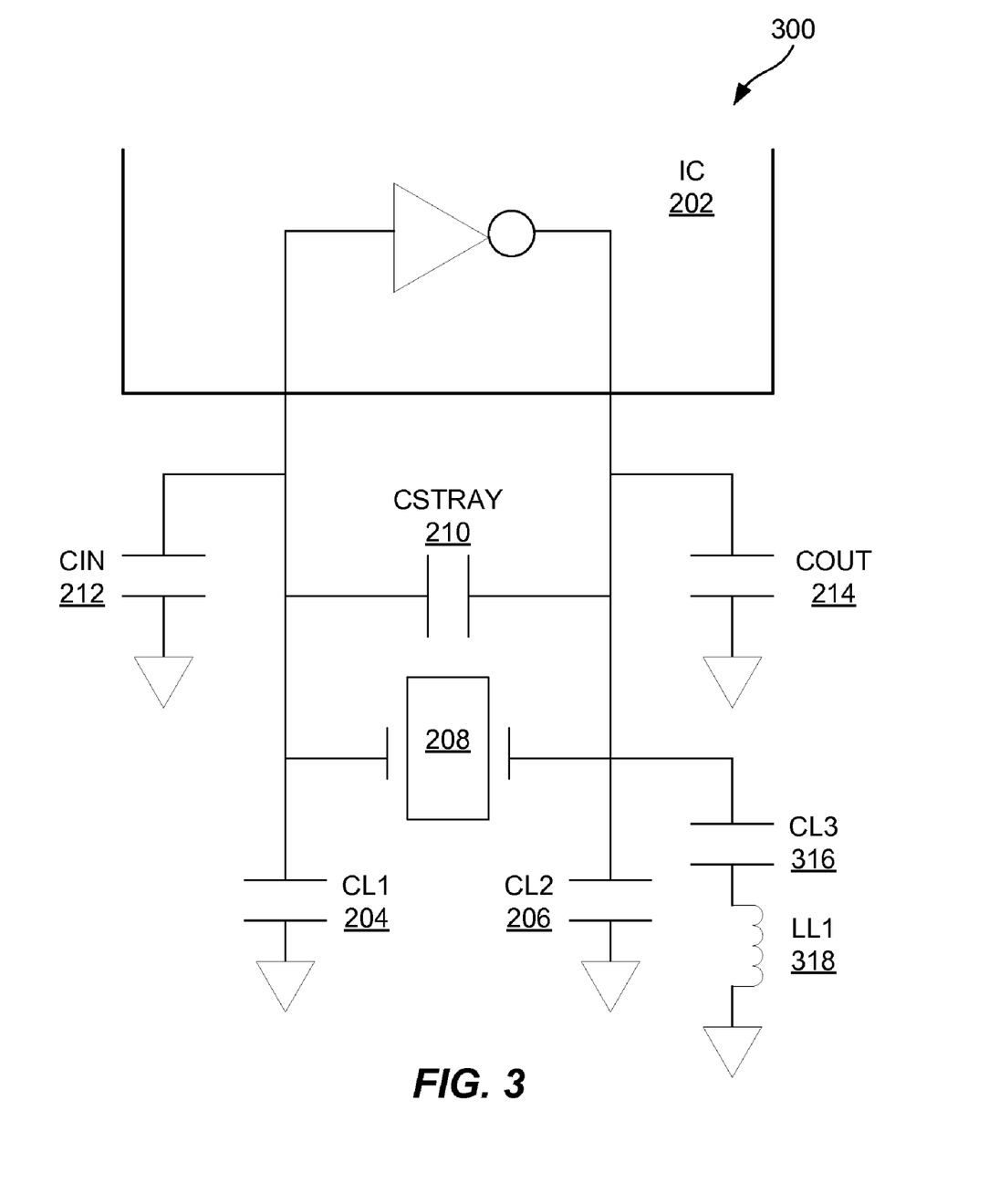
FIG. 3 illustrates an embodiment of a schematic diagram of an overtone oscillation circuit.

FIG. 3 illustrates an embodiment of a schematic diagram of an overtone oscillation circuit 300. The oscillation circuit 300 includes an integrated circuit 202, a first capacitor 204 (CL1), a second capacitor 206 (CL2), an oscillator crystal 208, a third capacitor 316 (CL3) and an inductor 318 (LL1). As described above, the capacitance 210 ($C_{stray}$) models the stray capacitance of the board and thus, the input capacitance 212 ($C_{in}$) and the output capacitance 214 ($C_{out}$) model the capacitance of the input and output pins of the integrated circuit 202. The value $C_{eff}$ models the combination of the capacitance of CL2, LL1 and CL3.

The load capacitance $C_L$ is defined as follows:

$$C_L=C_{para}+CL1*C_{eff}/(CL1+C_{eff}) \qquad \text{Equation 5}$$

The parasitic capacitance of the circuit ($C_{para}$) is defined in accordance with Equation 2 above.

The value of $C_{eff}$ may be computed as follows:

$$C_{eff}=CL1-1((2\pi F)^2*LL1) \qquad \text{Equation 6}$$

The tank frequency is defined as ⅔ the overtone frequency and yields the following equations for CL2 and LL1:

$$CL2=(9*C_{eff}+4*C_{out})/5 \qquad \text{Equation 7}$$

$$LL1=5/(4*(2\pi F)^2*(C_{eff}+C_{out})) \qquad \text{Equation 8}$$

The value of $C_{eff}$ is derived from CL, $C_{para}$ and CL1 in following equation:

$$C_{eff}=CL1*(CL-C_{para})/(CL1-(CL-C_{para})) \qquad \text{Equation 9}$$

The value of $C_{out}$ may be estimated as follows:

$$C_{out}=\tfrac{1}{2}*C_{para} \qquad \text{Equation 10}$$

A similar process as utilized for the fundamental oscillator circuit 200 (see FIG. 2) may be utilized to derive a parasitic capacitance of the circuit 300. The total value of the capacitance of the circuit ($C_{eff}$) is approximated based on an estimation of the parasitic capacitance ($C_{para}$). A crystal analyzer may be utilized to simulate an expected load condition for the oscillator crystal 208 off-circuit from the oscillator circuit 300. An iterative process may then be utilized as described above to determine the value of $C_{eff}$ that would replicate the frequency from the off-circuit measurement and a value of the parasitic capacitance ($C_{para}$) may be derived based on the determined value of $C_{eff}$ off-circuit. Thus, the design of the overtone oscillation circuit 300 may be optimized similarly to the fundamental oscillator circuit 200 (see FIG. 2).

Figure 4:
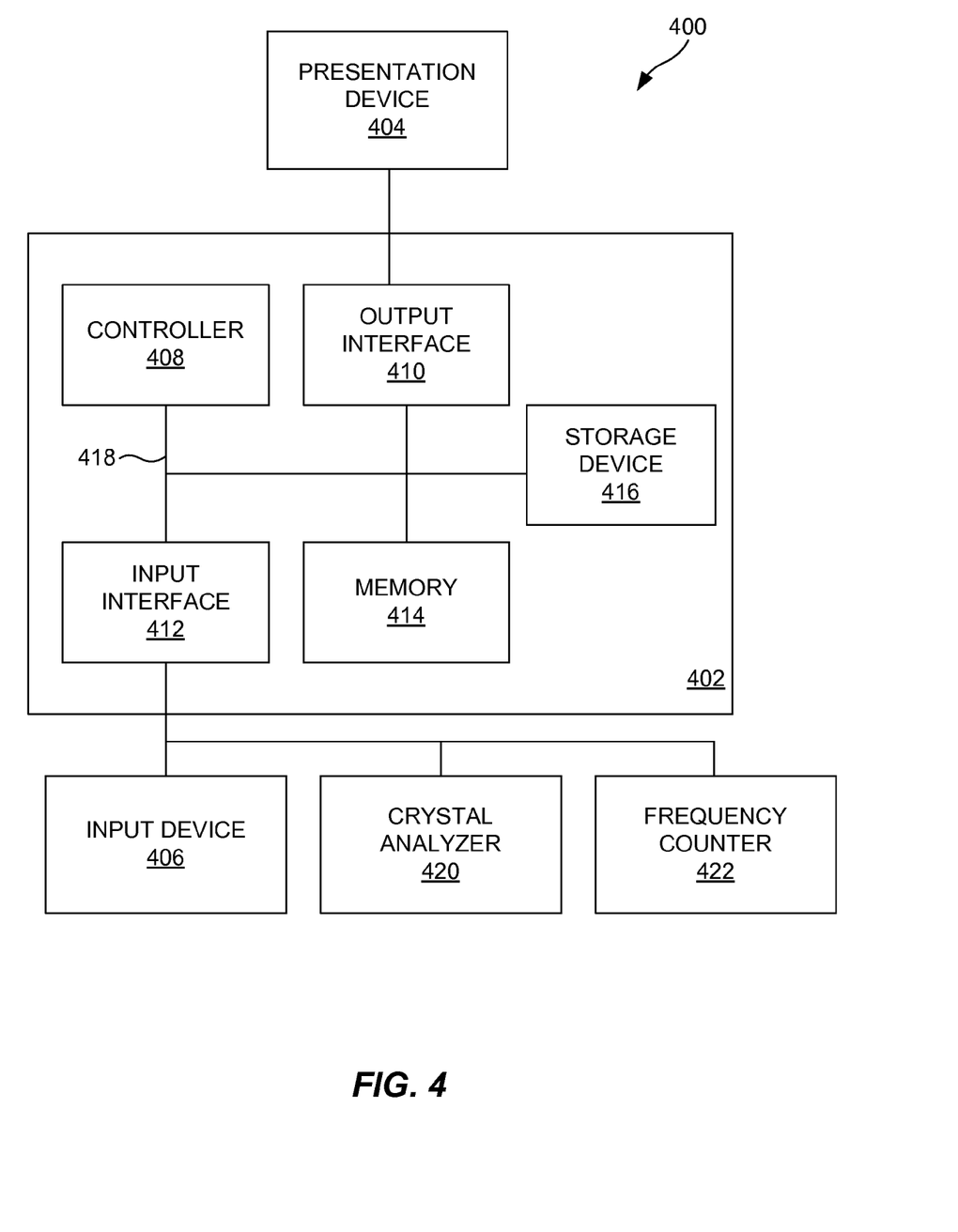
FIG. 4 illustrates an embodiment of a processing system for deriving a parasitic capacitance of an oscillator circuit.

FIG. 4 illustrates an embodiment of a processing system 400 for deriving a parasitic capacitance of an oscillator circuit. The processing system 400 includes a computer 402, a presentation device 404, an input device 406, a crystal analyzer 420 and a frequency counter 422. Each of these components is described in greater detail below. The processing system 400 may include other elements, components or devices not illustrated for the sake of brevity.

The computer 402 may include any type of computing device, such as personal computer, laptop, server or the like. The computer 402 includes a controller 408, an output interface 410, an input interface 412, a memory 414 and a storage device 416. The components of the computer 402 may be communicatively coupled together by one or more data buses 418 or other types of data connections.

The controller 408 is operable for controlling the operation of the computer 402. As used herein, controller 408 refers to a single processing device or a group of inter-operational processing devices. The operation of controller 408 may be controlled by instructions executable by controller 408. Some examples of instructions are software, program code and firmware. Various embodiments of controller 408 include any sort of microcontroller or microprocessor executing any form of software code.

The controller 408 is communicatively coupled to the memory 414, which is operable to store data during operation of the controller 408. Memory 414 may comprise any sort of digital memory (including any sort of read only memory (ROM), RAM, flash memory and/or the like) or any combination of the aforementioned. The computer 402 also includes a storage device 416, which is any kind of mass storage device operable to store files and other data associated with the computer 402. The storage device 416 may be embodied as any type of magnetic, optical or other type of storage device capable of storing data, instructions and/or the like.

The computer 402 also includes an output interface 410 operable to interface with the presentation device 404. More particularly, the output interface 410 is operable to output information for presentation by the presentation device 404. The output interface 410 may be operable to output any type of presentation data to the presentation device 404, including audio data, video data, audio/video (A/V) data, textual data, imagery or the like. In other embodiments, the output interface 410 may comprise a network interface operable to transmit data to other components, devices or elements, such as other computers, servers and the like. The presentation device 404 may comprise any type of device capable of presenting data received from the computer 402. In at least one embodiment, the presentation device 404 comprises a monitor communicatively coupled to the output interface 410 via any type of appropriate wired or wireless connection.

The input interface 412 is operable to interface with one or more devices, such as the input device 406, the crystal analyzer 420 and the frequency counter 422. The input device 406, the crystal analyzer 420 and the frequency counter 422 may comprise any type of devices for inputting data to the computer 402. More particularly, data received from the input device 406, the crystal analyzer 420 and/or the frequency counter 422 may be used to control the operation of the controller 408, the output of data to the presentation device 404 or the processing of data by a software application operating on the controller 408. The input interface 412 may be communicatively coupled to the input device 406, the crystal analyzer 420 and/or the frequency counter 422 using any type of wired or wireless connection, including USB, WiFi, Infrared and the like. Exemplary input devices 406 include keyboards, mice, buttons, joysticks, microphones, touch pads and the like.

For example, a user may provide input to an application operating on the computer 402. In at least one embodiment, an application operating on the controller 408 is configured to derive a parasitic capacitance of an oscillator circuit. Initially, a frequency of the oscillator crystal is measured by the crystal analyzer 420. The computer 402 may receive data (e.g., the frequency measurement) directly from the crystal analyzer 420 or the computer 402 may provide a prompt requesting a user to provide the frequency measured by the crystal analyzer 420 for input into an application operating on the computer 402.

Other frequency measurements may then be made by the frequency counter 422 in accordance with the teachings described above. Like the crystal analyzer 420, the input interface 412 may receive data directly from the frequency counter 422 or may prompt the user to provide input via the input device 406 regarding measurements performed by the frequency counter 422.

In at least one embodiment, the controller 408 is operable to process the input from the crystal analyzer 420 and the frequency counter 422 in addition to other input provided by the user to derive a parasitic capacitance of an oscillator circuit. The controller 408 may perform various operations in accordance with the process of FIG. 1 to derive a parasitic capacitance of an oscillator circuit. The controller 408 may then initiate output of the derived parasitic capacitance to a user via the presentation device 404.

Although specific embodiments were described herein, the scope of the invention is not limited to those specific embodiments. The scope of the invention is defined by the following claims and any equivalents therein.

We claim:

1. A method for determining a parasitic capacitance of an oscillator circuit, the method comprising:
   identifying a total load capacitance for an oscillator circuit;
   measuring a first frequency of an oscillator crystal separate from the oscillator circuit at the total load capacitance;
   measuring a second frequency of the oscillator crystal coupled to the oscillator circuit, the oscillator circuit including at least one first capacitor having a first capacitor value;
   measuring a third frequency of the oscillator crystal coupled to the oscillator circuit, the oscillator circuit including at least one second capacitor having a second capacitor value that is different than the first value;
   determining a third capacitor value, for use in the oscillator circuit, to cause the oscillator circuit to produce the first frequency, the third capacitor value determined based on the first frequency, the second frequency, the third frequency and the first and second capacitor values; and
   determining a parasitic capacitance of the oscillator circuit based on the third capacitor value and the total load capacitance.

2. The method of claim 1, wherein determining the third capacitor value further comprises:
   performing, by computer calculation, a linear interpolation utilizing the first frequency, the second frequency, the third frequency and the first and second capacitor values to determine the third capacitor value.

3. The method of claim 2, wherein performing the linear interpolation further comprises:
   determining a first offset of the second frequency relative to the first frequency;
   determining a second offset of the third frequency relative to the first frequency; and
   determining the third capacitor value based on the first capacitor value, the second capacitor value, the first offset and the second offset.

4. The method of claim 1, wherein measuring the first frequency further comprises:
   measuring the first frequency using a crystal analyzer to simulate the expected load conditions of the oscillator circuit.

5. A method for determining a parasitic capacitance of an oscillator circuit, the method comprising:
   measuring a first frequency of an oscillator crystal separate from an oscillator circuit under expected load conditions of the oscillator circuit;
   coupling the oscillator crystal to the oscillator circuit;
   measuring a second frequency of the oscillator crystal with a first set of capacitors in the oscillator circuit;
   measuring a third frequency of the oscillator crystal with a second set of capacitors in the oscillator circuit;
   determining a capacitor value, for use in the oscillator circuit, that comprises part of a load of the oscillator circuit under the load conditions to produce the first frequency of the oscillator circuit, the capacitor value determined based on the first frequency, the second frequency, the third frequency and the first and second capacitor values; and
   calculating a parasitic capacitance of the oscillator circuit based on the first frequency, the second frequency, the third frequency and values of the first and second sets of capacitors.

6. The method of claim 5, further comprising:
   selecting a final value of capacitors for use in the oscillator circuit based on the parasitic capacitance of the oscillator circuit.

7. The method of claim 5, wherein measuring the first frequency further comprises:
   estimating an expected parasitic capacitance of the oscillator circuit; and
   identifying the expected load capacitance based on the expected parasitic capacitance.

8. The method of claim 5, wherein calculating the parasitic capacitance further comprises:
   calculating a first offset of the second frequency of the oscillator crystal relative to the first frequency;
   calculating a second offset of the third frequency of the oscillator crystal relative to the first frequency; and calculating the parasitic capacitance based on the first offset, the second offset and the values of the first and second sets of capacitors.

9. The method of claim 8, wherein calculating the parasitic capacitance based on the first offset, the second offset and the values of the first and second sets of capacitors further comprises:
utilizing a computer to calculate a linear interpolation based on the first offset, the second offset and the values of the first and second sets of capacitors to calculate the parasitic capacitance.

10. The method of claim 5, wherein measuring the first frequency further comprises:
measuring the first frequency using a crystal analyzer to simulate expected load conditions of the oscillator circuit.

11. A method for determining a parasitic capacitance of an oscillator circuit, the method comprising:
identifying an expected load capacitance ($C_{total}$) of an oscillator circuit;
measuring a first frequency ($F_1$) of an oscillator crystal separate from the oscillator circuit under the expected load capacitance ($C_{total}$);
coupling the oscillator crystal onto the oscillator circuit;
selecting a first set of capacitors ($C_{v1}$) for the oscillator circuit;
measuring a second frequency ($F_2$) of the oscillator crystal with the first set of capacitors ($C_{v1}$);
selecting a second set of capacitors ($C_{v2}$) for the oscillator circuit;
measuring a third frequency ($F_3$) of the oscillator crystal with the second set of capacitors ($C_{v2}$); and
calculating, by computer, a parasitic capacitance ($C_{para}$) of the oscillator circuit based on $F_1$, $F_2$, $F_3$, $C_{v1}$ and $C_{v2}$.

12. The method of claim 11, wherein calculating the parasitic capacitance further comprises:
determining a first offset ($O_1$) of the second frequency relative to the first frequency;
determining a second offset ($O_2$) of the third frequency relative to the first frequency;
performing a linear interpolation, by the computer, to determine a third capacitor value ($C_{v3}$) that would be expected to produce the first frequency in the oscillator circuit, wherein $C_{v3}=C_{v1}+(C_{v2}-C_{v1})*O_2/(O_1-O_2)$; and
determining the $C_{para}$ of the oscillator circuit, wherein $C_{para}=C_{total}-C_{v3}/2$.

13. The method of claim 11, further comprising:
selecting a final value of capacitors for use in the oscillator circuit based on the parasitic capacitance ($C_{para}$) of the oscillator circuit.

14. The method of claim 11, wherein measuring the first frequency further comprises:
measuring the first frequency ($F_1$) using a crystal analyzer to simulate the expected load capacitance ($C_{total}$) of the oscillator circuit.

* * * * *

UNITED STATES PATENT AND TRADEMARK OFFICE
CERTIFICATE OF CORRECTION

PATENT NO. : 8,299,777 B2  Page 1 of 1
APPLICATION NO. : 12/649590
DATED : October 30, 2012
INVENTOR(S) : Leslie Carmichael et al.

It is certified that error appears in the above-identified patent and that said Letters Patent is hereby corrected as shown below:

In Column 10, Line 18, please change "$C_{v3}3/2$" to read -- $C_{v3}/2$ --

In Column 10, Line 21, please change "$(C_{para}))$" to read -- $(C_{para})$ --

Signed and Sealed this
Twenty-second Day of January, 2013

David J. Kappos
*Director of the United States Patent and Trademark Office*